US008112653B2

(12) United States Patent
Jeong

(10) Patent No.: US 8,112,653 B2
(45) Date of Patent: Feb. 7, 2012

(54) APPARATUS AND METHOD OF GENERATING POWER-UP SIGNAL OF SEMICONDUCTOR MEMORY APPARATUS

(75) Inventor: Duk-Ju Jeong, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 195 days.

(21) Appl. No.: 12/572,549

(22) Filed: Oct. 2, 2009

(65) Prior Publication Data
US 2010/0023794 A1    Jan. 28, 2010

Related U.S. Application Data

(62) Division of application No. 11/544,003, filed on Oct. 6, 2006, now Pat. No. 7,890,785.

(30) Foreign Application Priority Data

Oct. 19, 2005   (KR) .................... 10-2005-0098569

(51) Int. Cl.
  *G06F 1/00*   (2006.01)
  *G06F 11/30*  (2006.01)

(52) U.S. Cl. ................ 713/340; 713/300; 713/330

(58) Field of Classification Search ............ 713/300, 713/340
  See application file for complete search history.

(56) References Cited

U.S. PATENT DOCUMENTS

| 5,203,000 A * | 4/1993 | Folkes et al. .............. 713/340 |
| 5,249,298 A * | 9/1993 | Bolan et al. .............. 713/340 |
| 5,903,767 A * | 5/1999 | Little ...................... 713/323 |
| 6,055,642 A * | 4/2000 | Ikemoto .................. 713/322 |
| 6,069,832 A | 5/2000 | Ma et al. |
| 6,075,741 A | 6/2000 | Ma et al. |
| 6,731,562 B2 | 5/2004 | Roohparvar |
| 6,768,354 B2 | 7/2004 | Yamazaki et al. |
| 6,853,321 B2 | 2/2005 | Ohashi et al. |
| 7,290,128 B2 * | 10/2007 | Habib ....................... 713/2 |
| 7,469,353 B2 * | 12/2008 | Mundada et al. ........ 713/340 |
| 2003/0042795 A1 * | 3/2003 | Veendrick et al. ........ 307/38 |
| 2007/0225941 A1 * | 9/2007 | Shibata et al. ........... 702/182 |

FOREIGN PATENT DOCUMENTS

| JP | 10-199261 | 7/1998 |
| JP | 2004-311002 | 11/2004 |
| KR | 1019990012250 | 2/1999 |
| KR | 100224666 | 10/1999 |
| KR | 1020030047026 A | 6/2003 |
| KR | 1020030049186 A | 6/2003 |

* cited by examiner

*Primary Examiner* — Mark Connolly
(74) *Attorney, Agent, or Firm* — Venable LLP; Jeffri A. Kaminski

(57) ABSTRACT

An apparatus for generating a power-up signal of a semiconductor memory apparatus includes a first power-up signal generator that generates a first power-up signal to be activated on the basis of a comparison between a power supply voltage level supplied to the semiconductor memory apparatus and a first set voltage level, and a second power-up signal generator that generates a second power-up signal to be activated with a predetermined delay time on the basis of a comparison between the power supply voltage level and a second set voltage level.

4 Claims, 4 Drawing Sheets

APPARATUS AND METHOD OF GENERATING POWER-UP SIGNAL OF SEMICONDUCTOR MEMORY APPARATUS

CROSS-REFERENCE TO RELATED PATENT APPLICATION

This application is a divisional of U.S. patent application Ser. No. 11/544,003, filed Oct. 6, 2006, the subject matter of which application is incorporated herein by reference in its entirety.

This application claims the benefit of Korean Patent Application No. 10-2005-0098569, filed on Oct. 19, 2005, in the Korean Intellectual Property Office, the disclosure of which is incorporated herein in its entirety by reference.

BACKGROUND

1. Technical Field

The present invention relates to semiconductor memory apparatus, and more particularly, to an apparatus and a method of generating a power-up signal of a semiconductor memory apparatus.

2. Related Art

In a semiconductor memory apparatus, a power-up signal is a signal that indicates, when an external power supply Vext is supplied at the beginning of an operation, that the level of the power supply has reached a level required for normal operation of the memory. When the power supply does not reach the level for normal operation of the memory, that is, when the power supply is used before the level of the power supply reaches the level for normal operation of the memory, the semiconductor memory apparatus may operate abnormally. When the power-up signal is activated, the power-up signal may be in a high level or a low level. Hereinafter, it is assumed that the power-up signal is in the high-level.

Accordingly, the semiconductor memory apparatus essentially includes a power-up signal generator that generates the power-up signal and supplies the generated power-up signal to individual constituent elements for the operation of the semiconductor memory apparatus.

Hereinafter, an apparatus for generating a power-up signal of a semiconductor memory according to the related art will be described with reference to the accompanying drawings.

As shown in FIG. 1, an apparatus for generating a power-up signal of a semiconductor memory apparatus according to the related art includes a resistor array that includes resistors R1 to R4 and is connected between a power supply terminal Vext and a ground terminal, a first transistor array that includes transistors P1 to P3 and whose one end is connected to the power supply terminal Vext, a second transistor array that includes transistors N1 to N3, and whose one end is connected to the other end of the first transistor array and whose other end is connected to the ground terminal, and inverters 11 to 13 connected to a connection node A between the first transistor array P1 to P3 and the second transistor array N1 to N3.

All gates of the transistors P1 to P3 of the first transistor array are commonly connected to the ground terminal. Further, an intermediate node of the resistor array R1 to R4 is connected commonly to all gates of the transistors N1 to N3 of the second transistor array.

The operation of the related art having the above-described configuration will be described.

First, the transistors P1 to P3 of the first transistor array are P-type transistors and are in the ON state since the gates of the individual transistors are connected to the ground terminal when the power supply is initially applied. The N-type transistors N1 to N3 of the second transistor array are in the OFF state since the power supply voltage level is rising. Accordingly, the node A that is in the high level is changed to the low level by the inverters 11 to 13. Therefore, the power-up signal is in an inactivation state.

Meanwhile, the power supply is divided by the resistor array having the resistors R1 to R4. The divided power supply is supplied to the gates of all the transistors N1 to N3 of the second transistor array. Then, as the power supply voltage rises, all the transistors N1 to N3 of the second transistor array are changed from the OFF state to the ON state, and the node A is changed to the low level. Accordingly, the low level of the node A is output as the high level through the inverters 11 to 13, and thus the power-up signal is activated.

That is, the level of the node A is changed according to a size ratio between the first transistor array having the transistors P1 to P3 and the second transistor array having the transistors N1 to N3, and a threshold voltage of each of the transistors N1 to N3 of the second transistor array. Thus activation of the power-up signal is determined.

However, according to the related art, since the configuration for generating a power-up signal is determined by the ratios of the resistors and the transistors, there is a problem in that the power-up signal cannot be generated or cannot be normally generated due to variations in conditions, such as temperature or transistor characteristics.

SUMMARY

Embodiments of the present invention provide an apparatus and a method of generating a power-up signal of a semiconductor memory apparatus that can generate a normal power-up signal, regardless of changes in the characteristics of elements or environmental conditions.

In an embodiment of the present invention, an apparatus for generating a power-up signal of a semiconductor memory apparatus includes a first power-up signal generator that generates a first power-up signal to be activated on the basis of a comparison between a power supply voltage level supplied to the semiconductor memory and a first set voltage level, and a second power-up signal generator that generates a second power-up signal to be activated with a preset delay time on the basis of a comparison between the power supply voltage level and a second set voltage level.

According to another embodiment of the present invention, a method of generating a power-up signal of a semiconductor memory apparatus includes comparing a power supply voltage and a first set voltage and activating a first power-up signal on the basis of the comparison result, and comparing the power supply voltage and a second set voltage and activating a second power-up signal with a preset delay time on the basis of the comparison result.

DESCRIPTION OF EXEMPLARY EMBODIMENTS

Hereinafter, an apparatus and a method of generating a power-up signal of a semiconductor memory apparatus according to an exemplary embodiment of the present invention will be described in detail with reference to the accompanying drawings.

Figure 1:
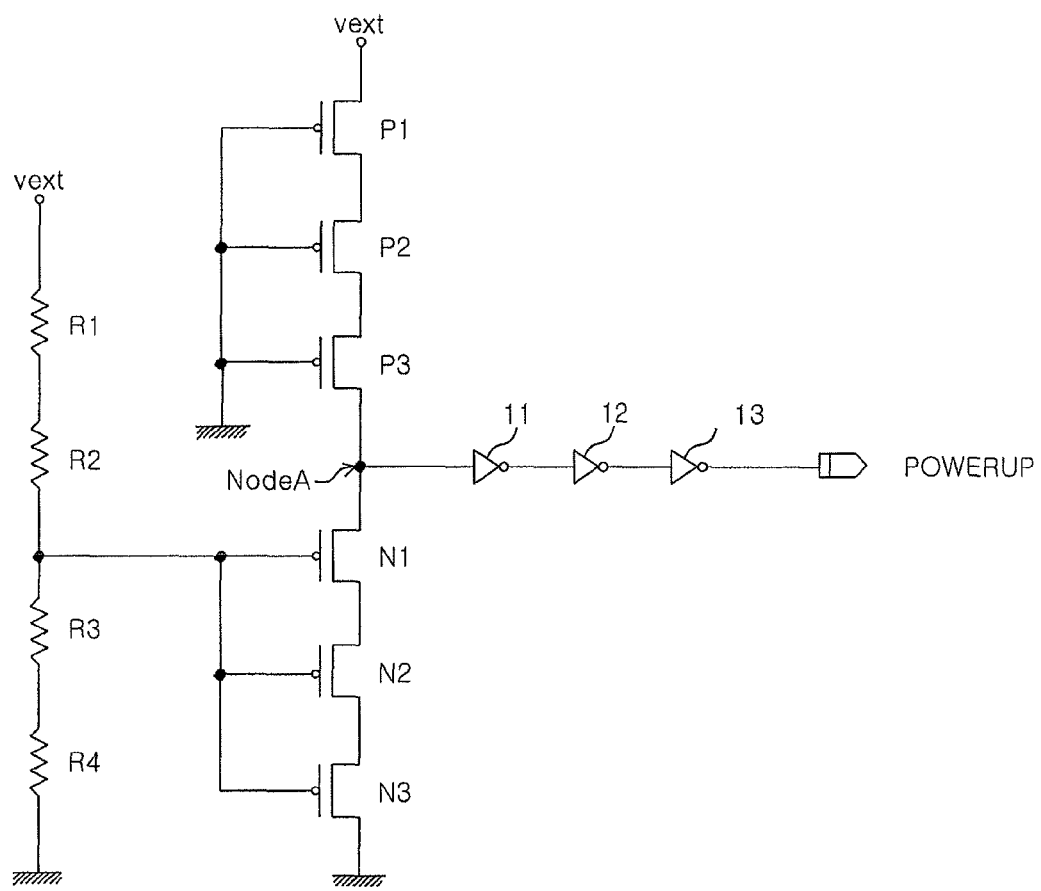
FIG. 1 is a circuit diagram showing the structure of an apparatus for generating a power-up signal of a semiconductor memory apparatus according to the related art.
Figure 2:
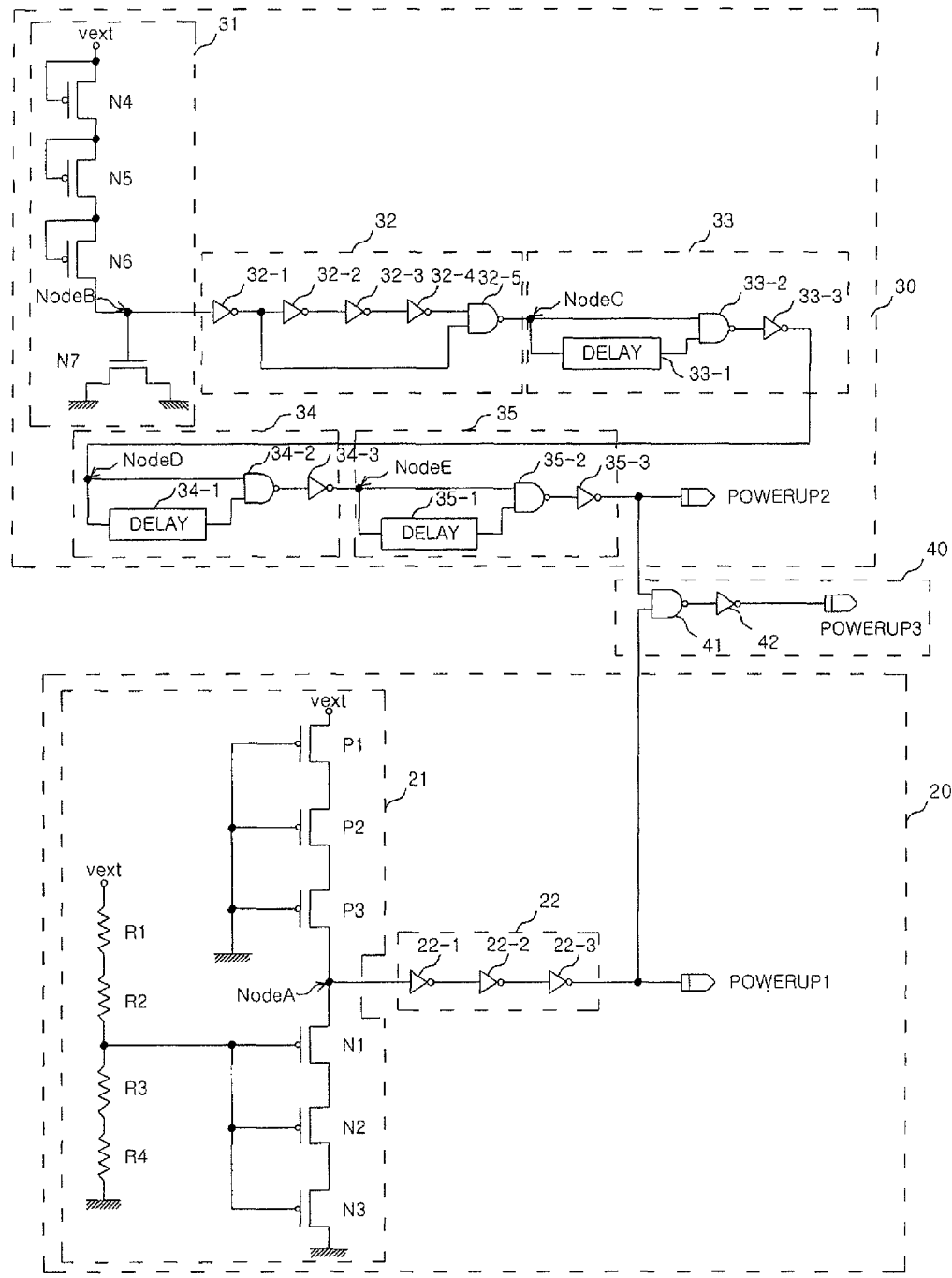
FIG. 2 is a circuit diagram showing the structure of an apparatus for generating a power-up signal of a semiconductor memory apparatus according to an exemplary embodiment of the present invention.
Figure 3A:
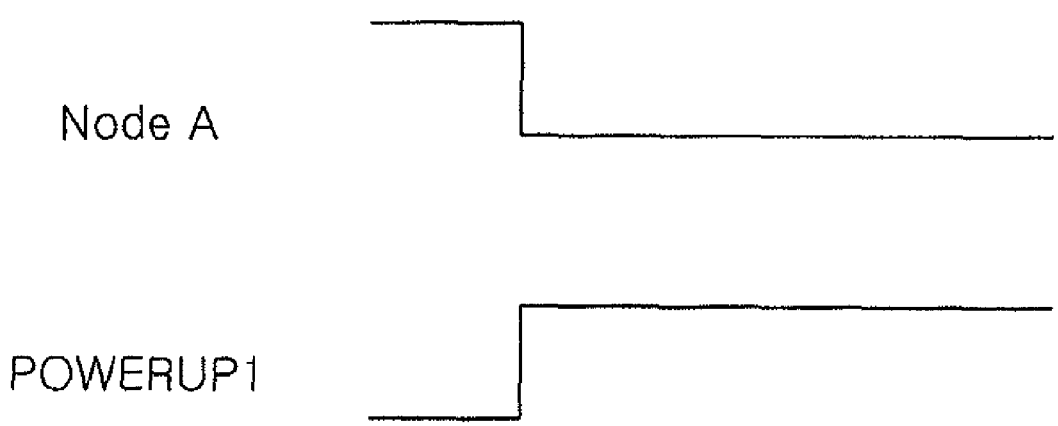
FIG. 3A is a timing chart showing an output waveform of a first power-up signal generator shown in FIG. 2.
Figure 3B:
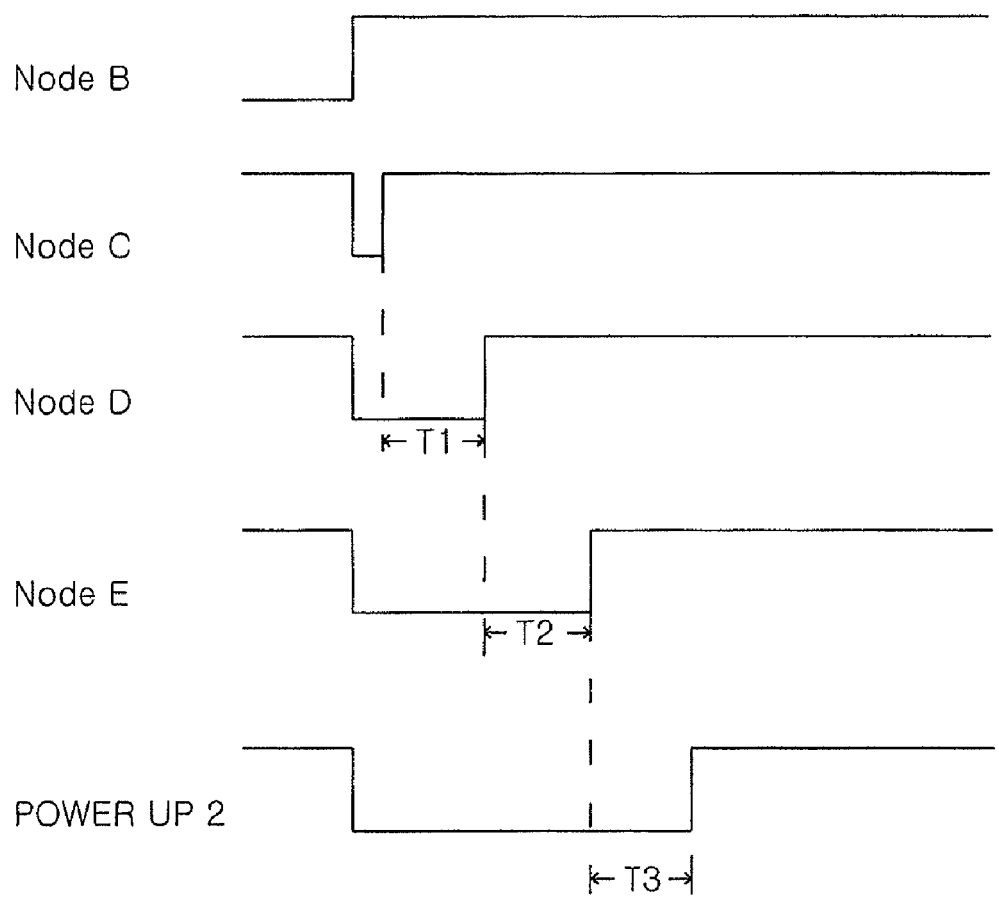
FIG. 3B is a timing chart showing an output waveform of a second power-up signal generator shown in FIG. 2.

FIG. 2 is a circuit diagram showing the structure of an apparatus for generating a power-up signal of a semiconductor memory apparatus according to an exemplary embodiment of the present invention. FIG. 3A is a timing chart showing an output waveform of a first power-up signal generator shown in FIG. 2. FIG. 3B is a timing chart showing an output waveform of a second power-up signal generator shown in FIG. 2.

As shown in FIG. 2, the apparatus for generating a power-up signal of a semiconductor memory apparatus according to an embodiment of the present invention includes a first power-up signal generator 20 that generates a first power-up signal Powerup1 to be activated on the basis of a comparison between a power supply voltage Vext level supplied to the semiconductor memory apparatus and a first set voltage level, a second power-up signal generator 30 that generates a second power-up signal Powerup2 to be activated with a predetermined delay time on the basis of a comparison between the power supply voltage level and a second set voltage level, and a third power-up signal generator 40 that generates a third power-up signal Powerup3 on the basis of the outputs of the first power-up signal generator 20 and the second power-up signal generator 30.

The first power-up signal generator 20 includes a comparator 21 that compares the power supply voltage level and the first set voltage level, and a signal generator 22 that generates the first power-up signal Powerup1 according to the output of the comparator 21. The comparator 21 includes a resistor array that comprises resistors R1 to R4 and is connected between a power supply terminal and a ground terminal, a first transistor array that includes transistors P1 to P3 and whose one end is connected to the power supply terminal Vext, and a second transistor array that includes transistors N1 to N3 and whose one end is connected to the other end of the first transistor array and whose other end is connected to the ground terminal. All gates of the transistors P1 to P3 of the first transistor array are commonly connected to the ground terminal. Further, an intermediate node of the resistor array of the resistors R1 to R4 is connected commonly to the gates of the individual transistors N1 to N3 of the second transistor array.

The signal generator 22 is connected to a connection node, node A, between the first transistor array having the transistors P1 to P3 and the second transistor array having the transistors N1 to N3. Further, the signal generator 22 includes inverters 22-1 to 22-3 that invert the output of the comparator 21 to generate the first power-up signal Powerup1.

The second power-up signal generator 30 includes a comparator 31 that compares the power supply voltage level and a second set voltage level, a pulse generator 32 that generates a reference pulse so as to inform an activation timing of a second power-up signal Powerup2 according to the output of the comparator 31, and first to third delay units 33 to 35 that delay the reference pulse for a time set therein so as to activate the second power-up signal Powerup2. The delay units 33 to 35 are given as an example, but the number and type of delay units can be changed according to design considerations.

The comparator 31 includes a transistor array that includes transistors N4 to N6 and whose one end is connected to the power supply terminal Vext, and a transistor N7 having a gate connected at node B to the transistor array including the transistors N4 to N6 and whose other ends are connected to the ground terminal so as to serve as a capacitor. The pulse generator 32 includes an inverter array that includes inverters 32-1 to 32-4 which receive the output of the comparator 31, and a NAND gate 32-5 that receives the output of the inverter array having the inverters 32-1 to 32-4 and the output of the first inverter 32-1 of the inverter array.

The first delay unit 33 includes a delay element 33-1 that delays the output of the pulse generator 32 at node C for a predetermined time, a NAND gate 33-2 that receives the output of the pulse generator 32 and the output of the pulse generator 32 delayed by the delay element 33-1, and an inverter 33-3 that inverts the output of the NAND gate 33-2.

Delay units 34 and 35 have similar structures as delay unit 33. Delay unit 34 includes a delay element 34-1 that delays the output of the delay unit 33 at node D for a predetermined time, a NAND gate 34-2 that receives the output of the delay unit 33 and the output of the delay unit 33 delayed by the delay element 34-1, and an inverter 34-3 that inverts the output of the NAND gate 34-2.

Delay unit 35 includes a delay element 35-1 that delays the output of the delay unit 34 at node E for a predetermined time, a NAND gate 35-2 that receives the output of the delay unit 34 and the output of the delay unit 34 delayed by the delay element 35-1, and an inverter 35-3 that inverts the output of the NAND gate 35-2.

According to an embodiment of the present invention, two or more second power-up signal generators 30 can be provided.

The third power-up signal generator 40 includes a NAND gate 41 that receives the first power-up signal Powerup1 and the second power-up signal Powerup2, and an inverter 42 that inverts the output of the NAND gate 41.

The operation of the exemplary embodiment of the present invention having the above-described structure will be described.

In the first power-up signal generator 20, since all the transistors P1 to P3 of the first transistor array of the comparator 21 are P-type transistors and all the gates of the transistors P1 to P3 are connected to the ground terminal when a power supply voltage Vext is initially applied, the transistors P1 to P3 of the first transistor array are in an ON state. Meanwhile, the N-type transistors N1 to N3 of the second transistor array are in an OFF state since the power supply voltage level is rising. Therefore, as shown in FIG. 3A, a node A that is at a high level is changed to a low level by the inverters 22-1 to 22-3 of the power-up signal generator 22. As a result, the power-up signal is in an inactivation state.

Sequentially, the power supply voltage Vext is divided by the resistor array having the resistors R1 to R4 of the comparator 21 and applied to the gates of all the transistors N1 to N3 of the second transistor array. Then, as the power supply voltage level rises, all the transistors N1 to N3 of the second transistor array are changed from the OFF state to the ON state, and the node A is changed to the low level. Therefore, as shown in FIG. 3A, the low level of the node A is output as the high level through the inverters 22-1 to 22-3 of the signal generator 22, and thus the power-up signal is activated.

Meanwhile, in the second power-up signal generator 30, since, when the power supply voltage Vext is initially applied, the power supply voltage level is low and the transistors N4 to N6 of the transistor array of the comparator 31 are in the OFF state. Thus, the node B is in the low level, as shown in FIG. 3B.

Then, as the power supply voltage level rises, since the transistors N4 to N6 of the transistor array of the comparator 31 become in the ON state, the node B is changed to the high level, as shown in FIG. 3B.

Next, as shown in FIG. 3B, according to the operation of the NAND gate 32-5 of the pulse generator 32, a low pulse is generated through the output of the pulse generator 32 at the node C. That is, the output of the inverter 32-1, which is input to the NAND gate 32-5, is changed from the low level to the high level, and the output of the inverter 32-4, which is input to the NAND gate 32-5, is changed from the high level to the low level. When the level of the two signals (outputs) are changed, since the signals are in the high level for a predetermined time, the NAND gate outputs a low level during a predetermined time and generates a low pulse.

Subsequently, as shown in FIG. 3B, the first to third delay units 33 to 35 delay the low pulse output from the pulse generator 32 by the respective delay times T1, T2, and T3 so as to hold the pulse to the low level, and then output the pulse at the high level so as to activate the second power-up signal Powerup2. That is, the second power-up signal generator 30 activates the power-up signal after a sufficient standby time so as to stably supply the power supply. In addition, the second power-up signal generator 30 copes with a case where the power-up signal is not normally generated by the first power-up signal generator 20.

Meanwhile, the third power-up signal generator 40 activates and outputs the third power-up signal Powerup3 only when the first power-up signal Powerup1 and the second power-up signal Powerup2 are activated. That is, only when both the first and second power-up signal generators 20 and 30 can stably generate the power-up signals, the third power-up signal generator 40 generates the third power-up signal so as to improve the stability of the power-up signals.

Although the present invention has been described in connection with the exemplary embodiments of the present invention, it will be apparent to those skilled in the art that various modifications and changes may be made thereto without departing from the scope and spirit of the present invention. Therefore, it should be understood that the above embodiments are not limiting but illustrative in all aspects. In addition, the scope of the present invention is defined by the appended claims rather than by the above exemplary embodiments, and all changes that fall within the metes and bounds of the claims, or equivalents of such metes and bounds are therefore intended to be embraced by the claims.

The described apparatus and the method of generating a power-up signal of a semiconductor memory apparatus can generate a normal power-up signal, regardless of changes of element characteristics or environmental conditions. Therefore, it is possible to improve operational reliability of the semiconductor memory apparatus.

What is claimed is:

1. A method of generating a power-up signal of a semiconductor memory apparatus, comprising:
   comparing a power supply voltage and a first set voltage and activating a first power-up signal on the basis of a result of the comparison; and
   comparing the power supply voltage and a second set voltage and activating a second power-up signal with a predetermined delay time on the basis of the result of the comparison between the power supply voltage and the second set voltage.

2. The method of claim 1,
   wherein the comparing of the power supply voltage and the second set voltage includes:
   generating a pulse on the basis of the result of the comparison between the power supply voltage and the second set voltage, and
   delaying the pulse so as to activate the second power-up signal.

3. The method of claim 1, further comprising:
   generating a third power-up signal by logically combining the first power-up signal and the second power-up signal.

4. The method of claim 3,
   wherein the third power-up signal is activated when both the first and second power-up signals are at a high level.

\* \* \* \* \*